United States Patent [19]

Ikeuchi et al.

[11] Patent Number: 5,084,672
[45] Date of Patent: Jan. 28, 1992

[54] MULTI-POINT PROBE ASSEMBLY FOR TESTING ELECTRONIC DEVICE

[75] Inventors: Harunobu Ikeuchi, Tokyo; Miyoshi Okumura, Kanagawa; Kaoru Sato, Tokyo; Yutaka Okumura, Kanagawa, all of Japan

[73] Assignee: Giga Probe, Inc., Japan

[21] Appl. No.: 483,040

[22] Filed: Feb. 20, 1990

[30] Foreign Application Priority Data

Feb. 21, 1989 [JP] Japan .................................. 1-40711
Aug. 1, 1989 [JP] Japan .................................. 1-199814

[51] Int. Cl.⁵ .................................................. G01R 1/06
[52] U.S. Cl. ................................. 324/158 P; 324/72.5
[58] Field of Search ............... 324/158 P, 158 F, 72.5; 439/482, 912, 495, 496, 792

[56] References Cited

U.S. PATENT DOCUMENTS 3,599,093  8/1971  Oates .................................... 439/482
3,849,728  11/1974  Evans ................................ 324/158 P

FOREIGN PATENT DOCUMENTS 54-43354  12/1979  Japan .

Primary Examiner—Ernest F. Karlsen
Attorney, Agent, or Firm—Lowe, Price, LeBlanc & Becker

[57] ABSTRACT

A plurality of probe wires are held by a probe supporter having a substantially rectangular cross-section. First, second and third side walls of the supporter, support the probe wires in a manner wherein they are arranged at predetermined intervals in an essentially parallel relationship with each other. The probe wires respectively extend from the first side wall to the second side wall by way of the third side wall. When testing an electronic-device, the third side wall faces a main surface of the device. The third side wall has a groove extending in a direction parallel with the main surface of at least one of the first and second sides wall. Each of the probe wires crosses the groove in a direction perpendicular to the direction along which the groove extends. The portions of the wires which cross the groove are pressed against the tested terminals.

13 Claims, 5 Drawing Sheets

MULTI-POINT PROBE ASSEMBLY FOR TESTING ELECTRONIC DEVICE

BACKGROUND OF THE INVENTION

The present invention relates generally to a multi-point probe assembly for testing electronic devices, and more particularly to such a probe assembly having a plurality of probe portions which are brought into electrical contact with signal-receiving and feeding terminals of a small-sized electronic device (wafer) such as an integrated circuit for a flat panel display or the like.

Various types of multi-point test probe assemblies have been developed hitherto for testing electronic devices of the above mentioned type. One example of such a device is disclosed in Japanese Patent Publication No. 54-43354 (corresponding to U.S. application Ser. No. 799,472 filed Feb. 14, 1969).

This prior art test probe assembly, illustrated in FIGS. 1 and 2, is equipped with a plurality of needle-like probe arms 2. Each of these arms have a radially outboard end secured fixedly to a printed board 1, and an intermediate portion which is supported by a combination of a circularly shaped supporting member 4 and a circularly shaped holding member 5 positioned on one of two main surfaces of the printed board 1. As shown in FIG. 1, the probe arms 2 are arranged in an essentially conical formation and at predetermined angular intervals with respect to the center of the printed board 1.

The radially outer end portions of the probe arms are connected to printed lines 6 formed on one surface of the printed board 1 by means of soldering (7). These printed lines 6 extend into through-holes 8 and are connected with pins (terminals) (not shown) of an external electronic-device test system, which are received therein.

The inboard end portions of the probe arms 2 protrude into the space formed inside the holding member 5 in a manner such that probe-points 3 formed at the inboard ends of the probe arms are accurately positioned on a given plane below the lower surface of the holding member 5.

During testing of an electronic device (not shown), the probe points 3 are respectively brought into contact with terminals of the electronic device with a predetermined force and thus establish electrical connections with the device under test.

However, this arrangement has suffered from the drawback that it is difficult to increase the number of the probe arms beyond a predetermined number. That is to say, it is difficult to reduce the interval between the probe arms due to the inherent crowding which results from the above described type of assembly.

More specifically, when coming into contact with the terminals of the electronic device under the above mentioned predetermined force, the probe arms 2 tend to deflect upwardly and inwardly. Accordingly, the distance between the inboard ends of the arms tends to reduce the point where electrical shorts are apt to occur between adjacent arms (particularly between the probe points).

Thus, the prior art test probe assembly has encountered the limitation that it is not suited to testing electronic devices which have a large number of terminals.

A further and more serious problem relates to damage of the terminals of the device under test. When the contact points come into contact with the terminals of the electronic device, due to the horizontal movement which the probe points tend to undergo as a result of the above mentioned arm deflection, deep scratches tend to be formed in the surfaces of the terminals. This problem is particularly prevalent in the case wherein the terminals are made of, or have a coating of, a soft metal such as gold.

Still further, the prior art test probe assembly is inherently unable to be applied to an electronic device in which signal-receiving and feeding terminals are located at joints of a plurality of rows and columns in a matrix-like formation or layout.

SUMMARY OF THE INVENTION

It is therefore an object of the present invention to provide a new and improved test probe assembly which allows testing of an electronic device with a large number of terminal pins and which obviates the chance of scratching or otherwise damaging the terminal pins of the device under test.

Another object of the present invention is to provide a new and improved test probe assembly which is applicable to an electronic device to be tested whose signal terminals are arranged in a matrix type of layout.

In brief, the above objects are achieved by an arrangement wherein a plurality of probe wires are held by a probe supporter having a substantially rectangular cross-section. First, second and third side walls of the supporter, support the probe wires in a manner wherein they are arranged at predetermined intervals in an essentially parallel relationship with each other. The probe wires respectively extend from the first side wall to the second side wall by way of the third side wall. When testing an electronic-device, the third side wall faces a main surface of the device. The third side wall has a groove extending in a direction parallel with the main surface of at least one of the first and second sides wall. Each of the probe wires crosses the groove in a direction perpendicular to the direction along which the groove extends. The portions of the wires which cross the groove are pressed against the tested terminals.

More specifically, the present invention is deemed to comprise a multi-point test probe assembly which features: a body; means defining a groove in the body; a plurality of wires disposed on the body, the wires being arranged to extend across the groove in an spaced parallel relationship with one another, the portions of the wires which extend across the groove being arranged to be brought into contact with contacts of an electronic device under test.

BRIEF DESCRIPTION OF THE DRAWINGS

The object and features of the present invention will become more readily apparent from the following detailed description of the preferred embodiments taken in conjunction with the accompanying drawings in which like elements or portions are denoted by like reference numerals and in which.

DETAILED DESCRIPTION OF THE INVENTION

Figure 1:
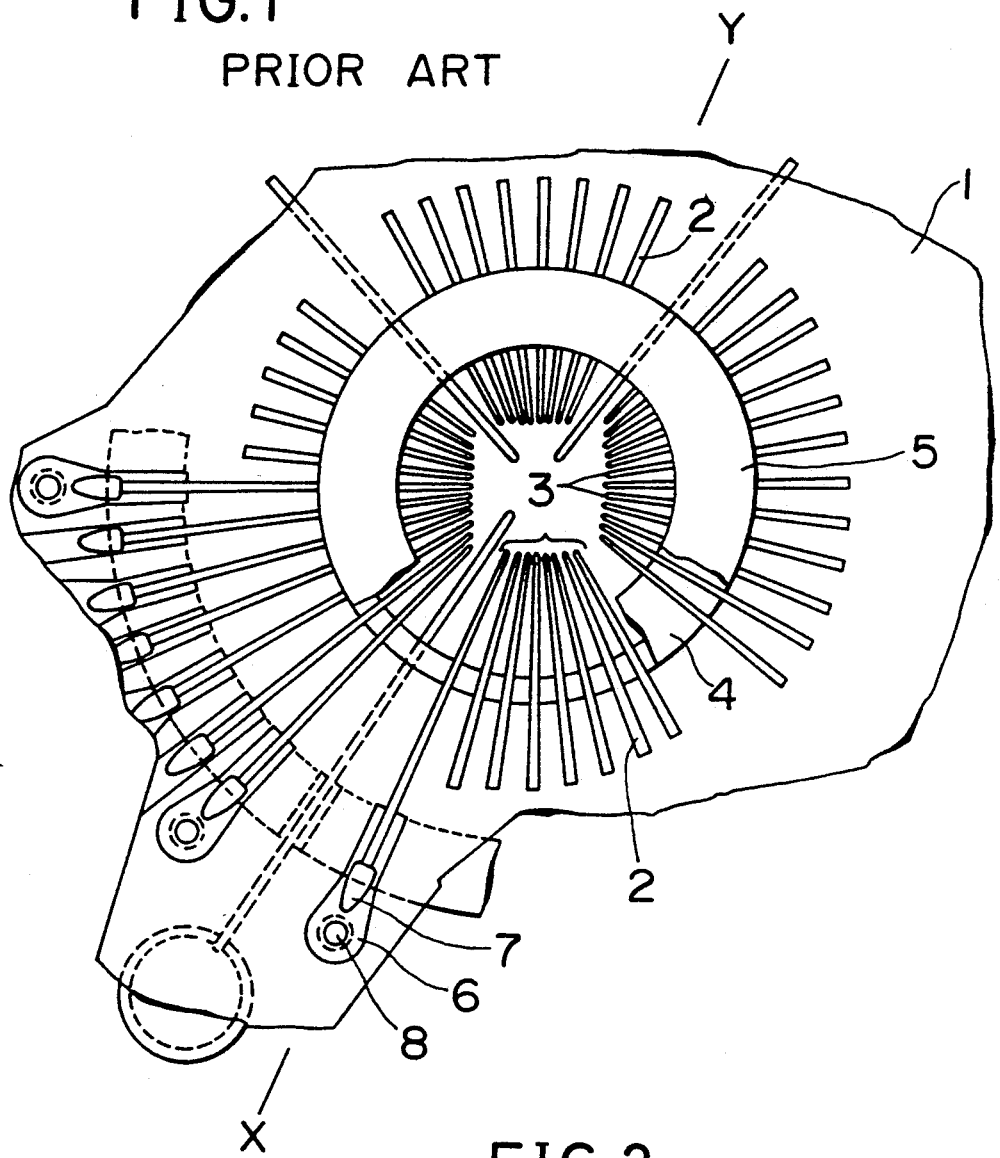
FIG. 1 is a partial plan view showing the conventional test probe assembly discussed in the opening paragraphs of the instant disclosure.
Figure 2:
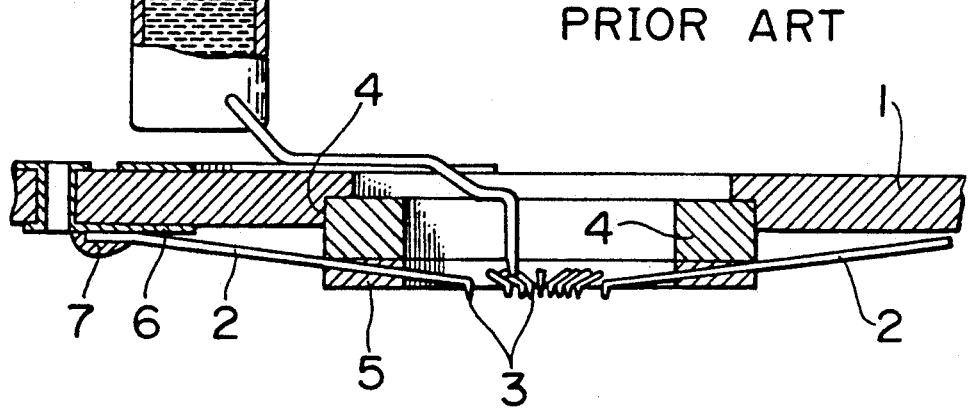
FIG. 2 is a cross-sectional view taken along section line X-Y in FIG. 1.
Figure 3:
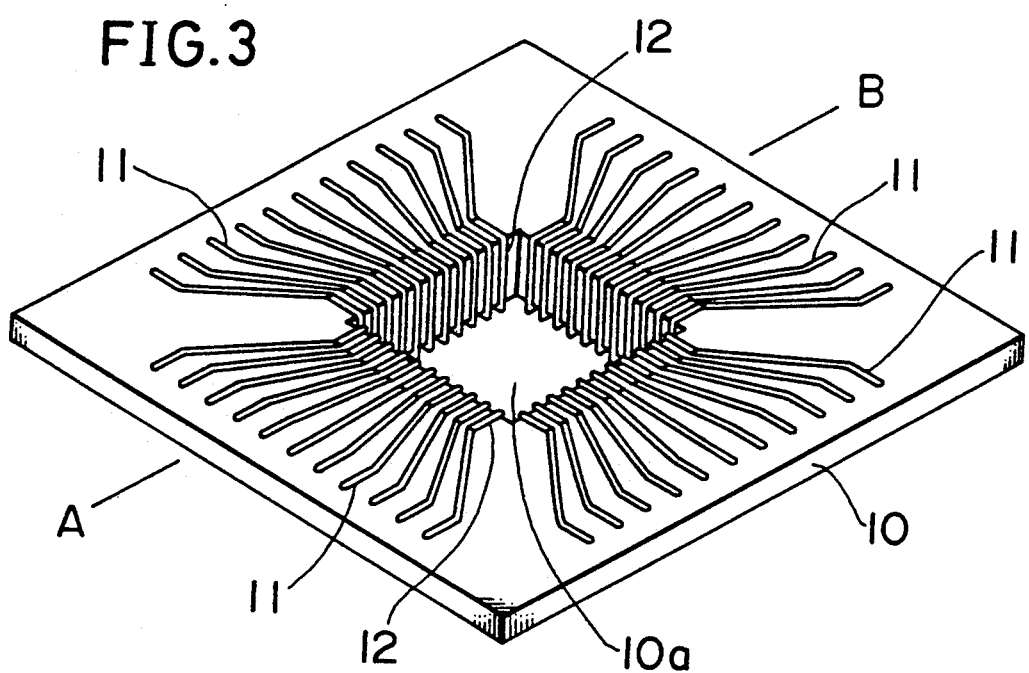
FIG. 3 is a perspective view illustrating a multi-point test probe assembly according to a first embodiment of the present invention.
Figure 4:
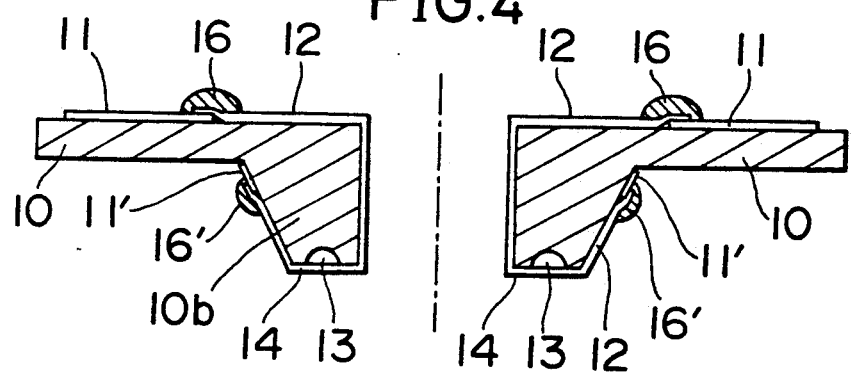
FIG. 4 is a cross-sectional view taken along section line A-B in FIG. 3 showing the first embodiment of the invention.

FIGS. 3 and 4 schematically illustrate a multi-point test probe assembly according to a first embodiment of the present invention.

This embodiment is suitable for testing a square electronic device having at its circumference a large number of signal-receiving and signal-feeding terminals. In this embodiment the multi-point test probe assembly comprises a ceramic substrate 10 which has a square, or rectangular, through-hole (opening) 10a therein and is provided at its lower side with a probe supporting portion 10b. This probe supporting portion 10b is formed about the lower circumference of the square through-hole 10a. The probe supporting portion 10b is arranged so as to protrude downwardly by a predetermined distance with respect to the lower surface of the outer circumferential portion of the substrate 10. The lower or bottom wall of the probe supporting portion 10b is recessed in a manner which defines a continuous essentially semicylindrical groove 13 which extends about the circumference of the square through-hole 10a.

The substrate 10 has a flat upper surface provided with a plurality of electrically conductive metallic lines 11 each having a thickness of about 200 μm (for example). The probe supporting portion 10b is provided with a plurality of electrically conductive metallic lines 11' proximate the lower surface of the substrate 10. These electrically conductive metallic lines 11, 11' are provided by means of a well known metallization technique and so as to be arranged along the sides of the substrate 10 in a manner wherein the distance therebetween reduces as they approach the perimeter of the through-hole 10a.

Also provided in the multi-point test probe assembly of the first embodiment are electrically conductive probe lines or wires 12 each of which is made of material such as beryllium copper and each of which has a diameter of about 100 μm (by way of example). The ends of the probe wires 12 are electrically connected to the conductive metallic lines 11, 11' respectively by means of a suitable coupling technique such as spot welding. The end connections are sealingly covered by a reinforcing adhesive material or the like 16, 16'. The outboard ends of the metallic lines 11 are arranged to be coupled to an external electronic-device testing system (not shown in FIGS. 3 and 4). The probe wires 12 are arranged at predetermined intervals (10 μm for example) in an essentially parallel relationship with each other and so as to respectively extend from the metallic lines 11 to the corresponding other metallic lines 11'. With this construction the wires partially surround the probe supporting portion 10b and extend across the groove 13 in a manner to define bride-like portions.

In other words, each of the probe wires 12 of the first embodiment is arranged to have first and second sections which are fixedly secured to the metallic lines 11, 11' and a third essentially central section 14 which extends across the bottom of the probe supporting portion 10b. The third sections 14 of the probe wires 12 have portions which span the groove 13 and which are spaced by predetermined intervals (for example, 10 μm).

When testing an electronic device, the multi-point test probe assembly of the first embodiment is brought toward the device under test with the bottom surface of the probe assembly parallel to the upper surface of the electronic device. The bridge portions of the third sections 14 of the probe wires 12 come into contact with corresponding protrusions or bumps which are formed on each terminal of electronic device under test. In response to this contact, the bridge portions of the probe wires 12 are pressed vertically down onto the terminals. The resulting flexure of the bridge portions produces a reaction force which induces a stable ohmic-contact of the bridge portion with the tested electronic device terminal. More specifically, as the probe wire 12 has a circular cross section, the bridge portion establishes a line-contact with the terminal it engages. This contact tends to induce elastical deformation whereby, further depression of the probe assembly toward the tested device allows the line-contact portion to broaden and establish stable ohmic-contact between the probe wire and the tested terminal. This elastic deformation of the essentially circular cross-section wire further tends to push or displace any contaminating and/or extraneous material, which may be present on the surface of the contact, to either side of the wire and thus ensures a reliable electric contact is established.

By way of example, the above-mentioned bumps each has a height of about 20 μm from the main surface of the substrate of the electronic device under test, and the probe assembly an overdrive value of approximately 15 μm.

Figure 5:
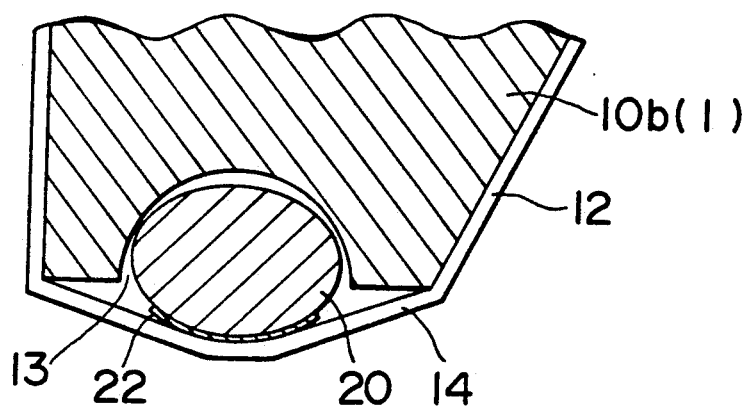
FIG. 5 is a cross-sectional view showing a first variant of the first embodiment.

FIG. 5 illustrates a first variant of the first embodiment. In this arrangement a supporting portion 10b(1) shown in FIG. 5 differs from its counterpart 10b (FIG. 4) in that the groove 13 receives an elastic member 20 having a substantially elliptical cross section. The other portions of the supporting portion 10b(1) are same as those of the supporting portion 10b. The elastic member 20 is made of Neoprene (Trademark) rubber or Silicone rubber, and induces a tensile force in the third portion 14 of the probe wire 12 by way of a film member 22. This film member 22 prevents the probe wire 14 from cutting into the elastic member 20, has a thickness of about 40 μm and is made of polyimide resin (for example). It is preferable that the film member 22 does not adhered to the probe wire 12 in order not to prevent any adverse affect on the predetermined separation between the probe wires 12. According to the modification as shown in FIG. 5, the contact pressure more than 200 gram can be derived.

Figure 6:
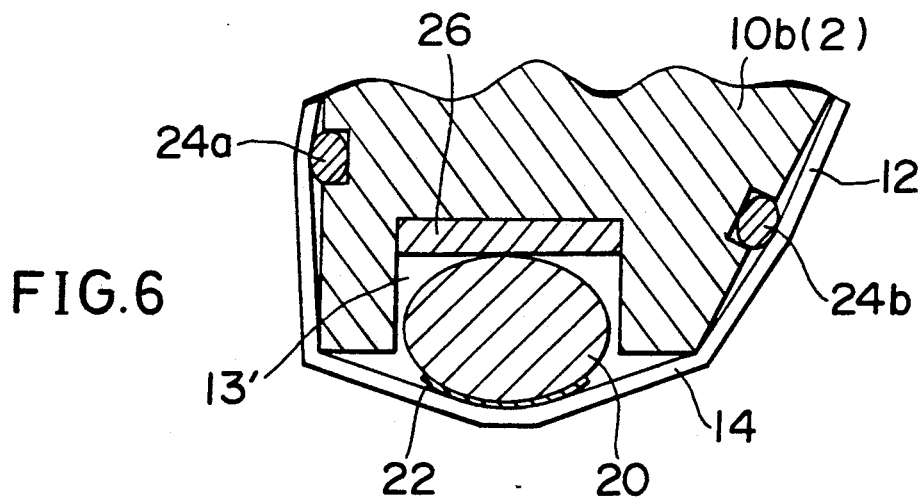
FIG. 6 is a cross-sectional view showing a second variant of the first embodiment.

FIG. 6 shows a second variant of the first embodiment. In this arrangement a supporting portion 10b(2) differs from the first modification shown in FIG. 5 in that the second modification additionally includes probe wire tensioning members 24a, 24b and 26 which are arranged around and within the probe supporting portion 10b(2). In this second variant, a groove 13' having a rectangular cross-section accommodates therein a tape-like tensioning member 26. Each of the probe wire tensioning members 24a, 24b is formed of a silicone rubber tube. The other tensioning member 26 formed of a foamed or cellular plastic sheet.

An object of this second modification shown in FIG. 6 is to be able to, during testing an electronic device, obtain predominately linear movement of the portion of the probe wire 12 which makes contact and thus enable a large overdrive value.

Figure 7:
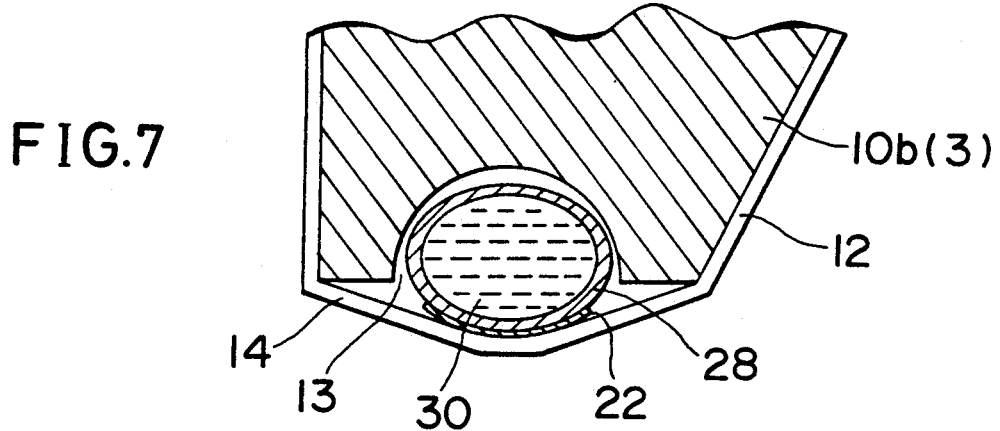
FIG. 7 is a cross-sectional view showing a third variant of the first embodiment of the present invention.

FIG. 7 shows a third modification or variant of the first embodiment. In this arrangement a probe supporting portion 10b(3) includes an elastic tube 28 which is disposed within the groove 13 in place of the elastic member 20 shown in FIG. 5. The elastic tube 28 is filled with a pressurized viscous fluid (30) such as silicone oil. Deformation of the elastic tube 28, caused by the contact pressure exerted by the probe wire 12 during testing an electronic device, is locally suppressed due to the viscosity of the fluid and, accordingly adjacent probe wires 12 are not adversely influenced by neighboring deformations of the tube 28.

Figure 8:
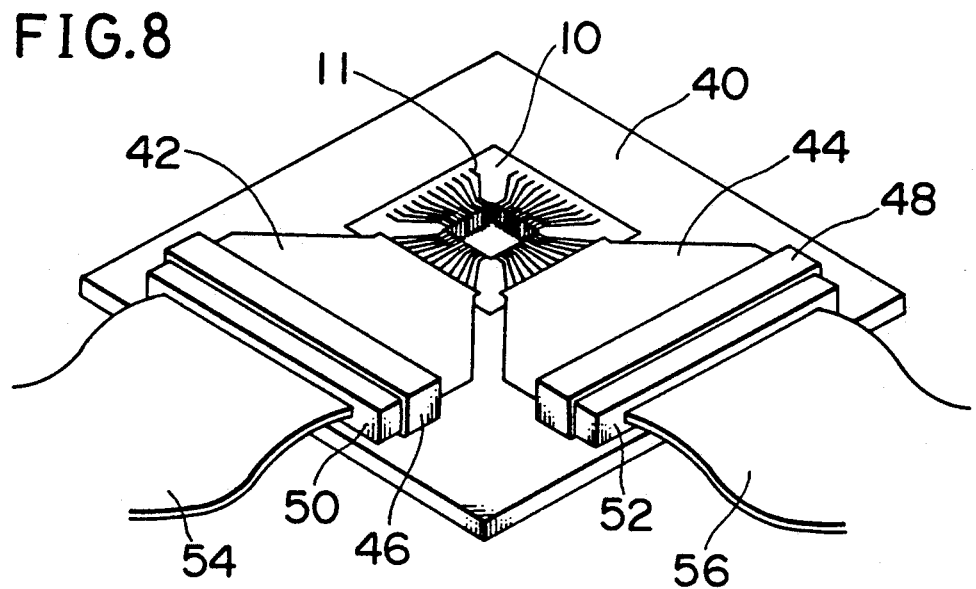
FIG. 8 is a perspective view showing a multi-point test probe assembly according to the first embodiment installed in a testing system.

FIG. 8 illustrates the installation of the multi-point test probe assembly according to the first embodiment. As shown, the test probe assembly is installed in a rectangular opening formed in the center of a supporting plate 40 made of an epoxy resin. The conductive metallic lines 11 are connected at one end to flexible printed circuits 42, 44. The flexible printed circuits are in turn coupled to the receptacles or connectors 46, 48, respectively.

When testing an electronic device, plugs 50, 52 are inserted into the corresponding receptacles 46, 48. An external electronic-device testing system (not shown) is coupled to the plugs 50, 52 by way of flat cables 54, 56.

In the first embodiment, each of the probe wires 12 is made of beryllium copper wire having an essentially uniform diameter which ranges from about 20 μm to about 100 μm (by way of example). If the probe wire 12 requires acid resistance, they are plated with platinum, rhodium or palladium. Further, the probe wire 12 may plated with titanium or tungsten so as to ensure abrasion resistance.

Figure 9:
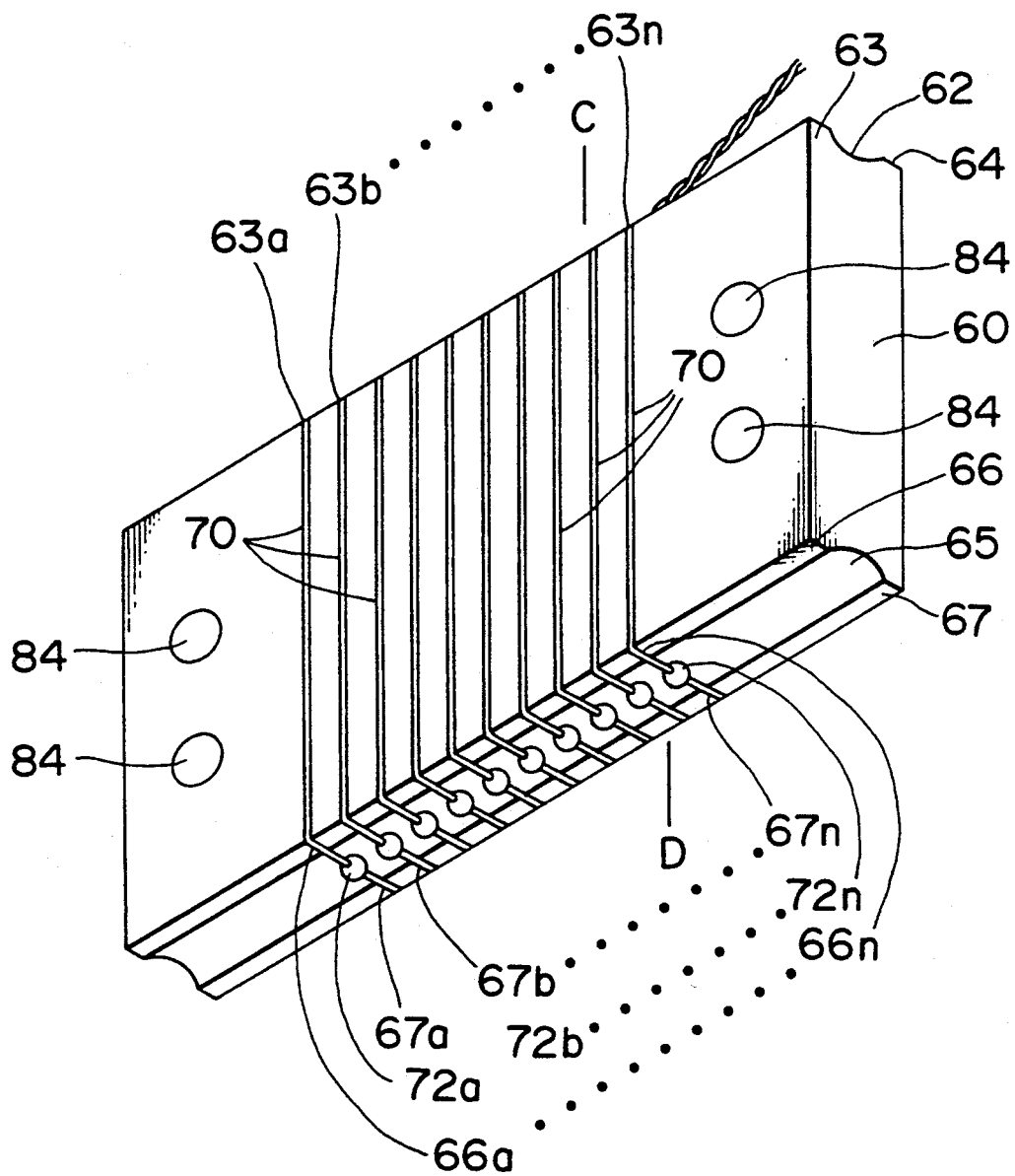
FIG. 9 is a perspective view illustrating a multi-point test probe assembly according to a second embodiment of the present invention.
Figure 10:
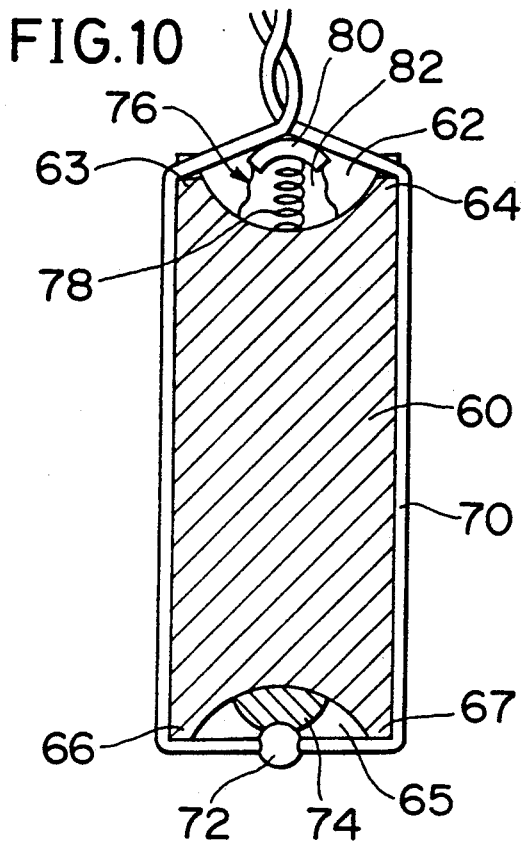
FIG. 10 is a cross-sectional view taken along section line C-D in FIG. 9.

FIGS. 9 and 10 schematically illustrate a multi-point test probe assembly according to a second embodiment of the present invention.

In FIGS. 9 and 10, the multi-point test probe assembly comprises a ceramic body 60 having a thickness of about 300 μm. The upper and lower side walls of the body 60 are respectively recessed so as to form grooves 62 and 65. The groove 62 define wire supporting shoulders 63, 64 on either side thereof. The groove 65 similarly wire supporting shoulders 66 and 67.

A plurality of essentially parallel channels 63a-63n are formed in the surface of the probe wire supporting portion 63 at predetermined intervals (50 μm for example). Similarly, the probe wire supporting shoulders 66, 67 are respectively provided with a plurality of channels 66a-66n and 67a-67n at the same interval as previously mentioned (viz., 50 μm). These channels ensure that the probe wires 70 are maintained at the desired spacings. Although not shown in FIG. 9, similar channels for receiving the probe wires 70 are also provided in the surface of the probe supporting shoulder 64. The channels each have a width of about 11 μm and a depth of about 11 μm. As an alternative to the above-mentioned probe wire accommodating channels, a plurality of banks or corrugations may be arranged in the surface of each of the probe wire supporting shoulders 63, 64, 66 and 67 for the same purposes, viz., separating the probe wires 70.

Each of the probe wires 70, which is formed of a high-tensile steel wire and has a diameter of about 10 μm, is arranged to support a stainless steel ball (72a, 72b, . . . or 72n) on the portion which extends across the groove 65. More specifically, each of the probe wires 70 passes through a through-hole having a diameter of about 12.5 μm. The probe wires 70 and the stainless steel balls 72a-72n, are plated with a layer of gold having a thickness of about 3000 Angstrom.

As shown in FIG. 10, the stainless steel balls 72a-72b are prevented from slipping by means such as elastic epoxy resin adhesive 74 (not shown in FIG. 9 for ease of illustration). Each of the probe wires 70 is twisted above the upper groove 62 and extends to a suitable connector for coupling the test probe assembly in question to an external electronic-device testing system (not shown). Provided within the upper groove 62 are a plurality of tensioning means 76 for providing predetermined tensile force to the probe wires 70. In this instance, the tensioning means 76 each comprises a spring 78, a plate 80 and adhesive. The spring 78 presses a plate 80 against the probe wire 70 and is held in place by the adhesive 78 (epoxy resin).

The body 60 is manufactured utilizing YAG (Yttrium-Aluminum-Garnet) laser apparatus and, if higher precision is required laser-assisted chemical etching techniques may be used. The body 60 should have sufficiently smooth surfaces. The through-hole of the stainless steel ball can be formed using YAG laser apparatus or spark discharge device The second embodiment is applicable to testing electronic devices having matrix type terminal arrangements by stacking a plurality of bodies 60 (FIG. 9) together in a manner the major surfaces face one another. In this case, through-holes 84 are used to connect and align combine the bodies 60 in a side-by-side configuration. Dielectric sheets are provided between adjacent bodies 60.

Figure 11:
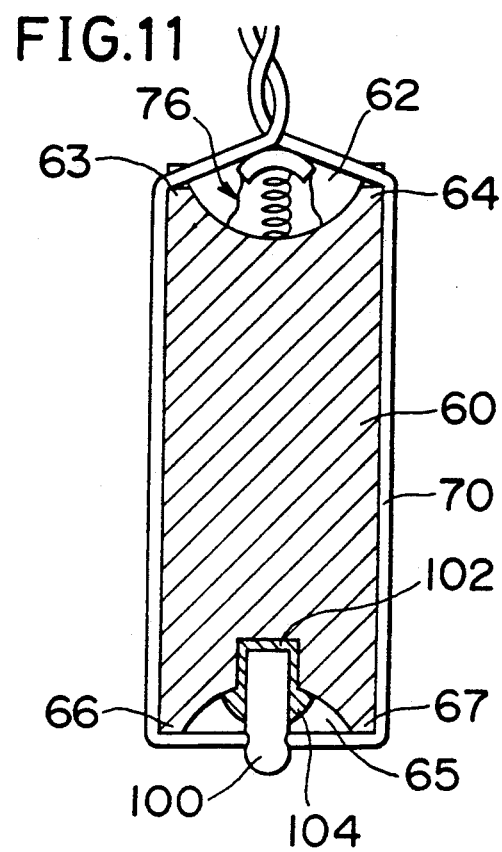
FIGS. 11, 12 and 13 are cross-sectional views showing first to third variants of the second embodiment.

FIG. 11 illustrates a first variant of second embodiment. In this modification each of the stainless steel balls 72a-72n is replaced with a piece of stainless wire or rod (depicted by 100 in FIG. 11). The stainless rod 100 has a length of about 2 mm and a diameter of about 30 μm. As in the second embodiment in FIGS. 9 and 10, the rod 100 has a through-hole through which the probe wire 70 is inserted. As shown in FIG. 11, one end of the rod 100 is received in a blind bore 102 formed in the groove 65 and is held with elastic epoxy adhesive (104).

Figure 12:
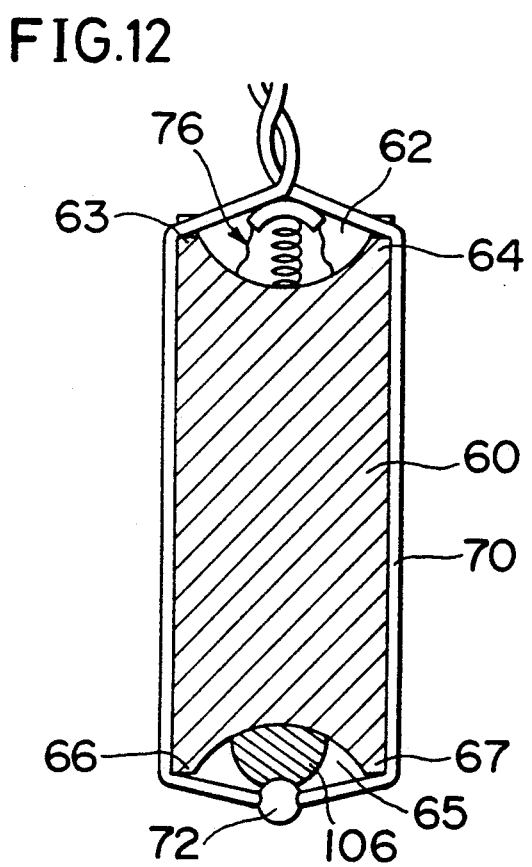

FIG. 12 shows a second modification of the second embodiment. This arrangement differs from that of the second embodiment in that the elastic epoxy resin adhesive 74 of the former arrangement is replaced with an elastic member 106 of silicone rubber. Since the ball 72 is pressed down by the force exerted by the silicon rubber 106, the ball 72 is displaced when depressed against a tested terminal and exhibits a large contact pressure thereagainst.

Figure 13:
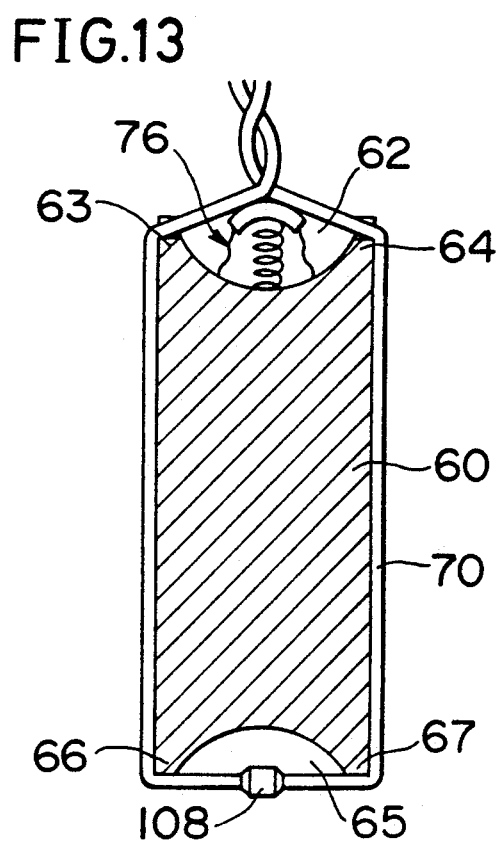

FIG. 13 illustrates a third modification of the second embodiment. In this variation, a limited portion of the high tension probe wire bridging the groove 65 is plated by abrasion resistance material which consists of gold and a small amount of cobalt. The hard plating layer 108 is formed on the probe wire 70 in a manner to provide an arrangement similar to the provision of a hollow tube or the like. In this arrangement the contact resistance between the plating and the probe wire is negligible.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention. For example the stainless steel balls can be replaced with bronze or ceramic ones. In the case of ceramic balls, an electrically conductive plating is required in the event that it is itself insufficiently conductive.

What is claimed is:

1. A multi-point test probe assembly comprising:
   a body member with a groove provided in one surface thereof and;
   a plurality of wires disposed on said body, each of said plurality of wires extending across said groove in a transverse manner and in spaced apart parallel relationship with one another so that portions of said plurality of wires extend across said groove, said portions of said plurality of wires which extend across said groove being arranged to be brought into contact with contacts of an electronic device under test.

2. A multi-point test probe assembly as claimed in claim 1, further comprising a first tensioning member provided in said groove so as to exert a force on the portions of said wires which cross said groove.

3. A multi-point test probe assembly as claimed in claim 2, wherein said first tensioning member is a hollow tube of elastic material, said hollow tube being filled with a pressurized viscous fluid.

4. A multi-point test probe assembly as claimed in claim 3, said viscous fluid is silicone oil.

5. A multi-point test probe assembly as claimed in claim 2, further comprising second and third tensioning members each of which is made of elastic material, said second and third tensioning members being respectively provided in first and second side walls of said body in a manner to be parallel with said groove.

6. A multi-point test probe assembly as claimed in claim 5, further comprising a fourth tensioning member provided between the bottom of said groove and said first tensioning member.

7. A multi-point probe assembly as claimed in claim 1, further comprising a tensioning member for exerting a force on said plurality of wires, said tensioning member being provided on a surface of said body member which is opposed to said grooved surface.

8. A multi-point test probe assembly as claimed in claim 7, wherein each of said plurality of wires has a plating layer along a limited length of the portion which extends across said groove.

9. A multi-point test probe assembly as claimed in claim 8, wherein said plating layer is an abrasion resistance layer consisting of gold and cobalt.

10. A multi-point test probe assembly as claimed in claim 7, further comprising a plurality of balls, said balls each having a through-hole through which one of said plurality of wires is inserted, each of said balls supported in the shadow of said groove and being held in place by an elastic resin adhesive.

11. A multi-point test probe assembly as claimed in claim 10, further comprising means for biasing said balls in a direction away from said groove.

12. A multi-point test probe assembly as claimed in claim 7, further comprising a plurality of rods, each of said rods having a through-hole through which one of said plurality of wires is inserted, said rods being disposed on the portions of the wires which cross said groove, one end of each rod being held in place by an elastic adhesive.

13. A multi-point test probe assembly as claimed in claim 12, wherein said one end of each of said rods is received in a recess provided in a wall of said groove.

* * * * *